United States Patent [19]

Hayashi

[11] Patent Number: 4,600,994

[45] Date of Patent: Jul. 15, 1986

[54] PHASE DIFFERENCE MEASURING APPARATUS

[75] Inventor: Mishio Hayashi, Saitama, Japan

[73] Assignee: Takeda Riken Kogyo Kabushikikaisha, Tokyo, Japan

[21] Appl. No.: 538,986

[22] Filed: Oct. 4, 1983

[30] Foreign Application Priority Data

Oct. 6, 1982 [JP] Japan .................. 57-176901
Feb. 17, 1983 [JP] Japan .................. 58-26051

[51] Int. Cl.⁴ .......................................... G01R 25/00
[52] U.S. Cl. .................. 364/484; 324/83 D; 328/133
[58] Field of Search ............ 364/481, 484; 307/510, 307/511, 525, 526; 328/133, 155; 324/82, 83 R, 83 D

[56] References Cited

U.S. PATENT DOCUMENTS

| | | | |
|---|---|---|---|
| 3,663,956 | 5/1972 | Purdy et al. | 328/133 |
| 3,760,270 | 9/1973 | Irvin | 324/83 D |
| 3,764,903 | 10/1973 | Griswold | 324/83 D |
| 3,953,794 | 4/1976 | Moore | 328/133 |
| 4,400,664 | 8/1983 | Moore | 328/133 |
| 4,488,108 | 12/1984 | Treise et al. | 328/133 |

Primary Examiner—Gary Chin
Attorney, Agent, or Firm—Staas & Halsey

[57] ABSTRACT

First and second input signals are waveform-shaped into rectangular wave signals and, in a period measuring mode, one of the rectangular wave signal is input into a time interval measuring circuit and clock pulses are counted during the period of the rectangular wave signal. In a time interval measuring mode, the clock pulses are counted by the time interval measuring circuit over the time interval between one edge of the one rectangular wave signal and the corresponding edge of the other rectangular wave signal, and the phase difference between the first and second input terminals is calculated from the count values.

18 Claims, 29 Drawing Figures

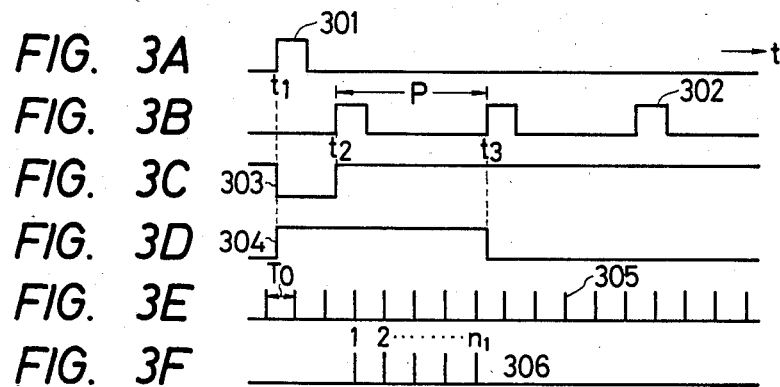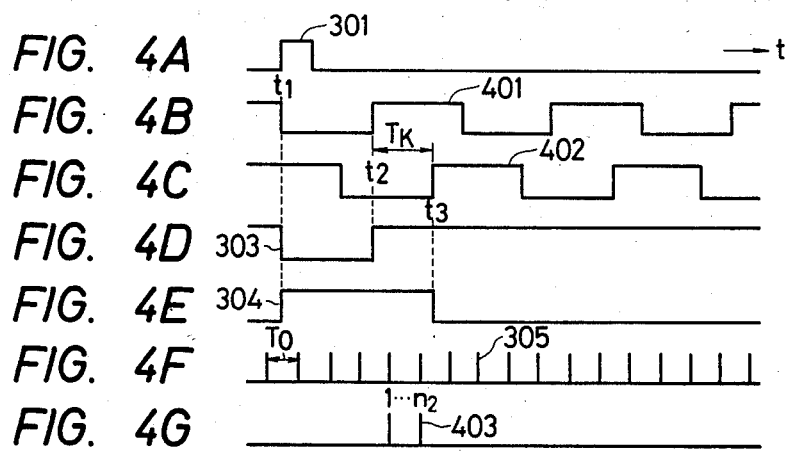

FIG. 5A
FIG. 5B
FIG. 5C
FIG. 5D
FIG. 5E
FIG. 5F
FIG. 5G
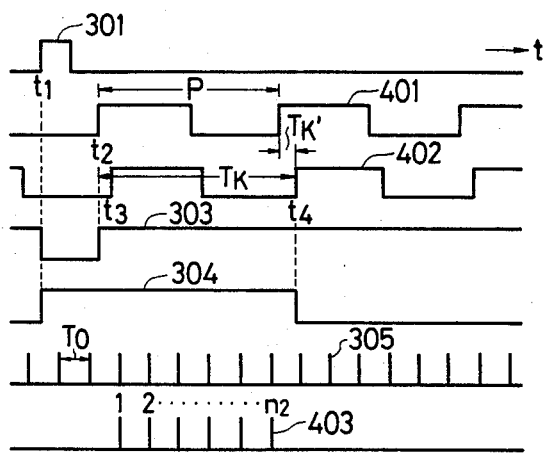
FIG. 8
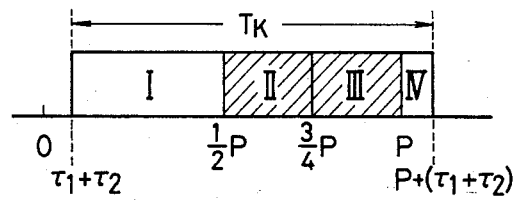
FIG. 11
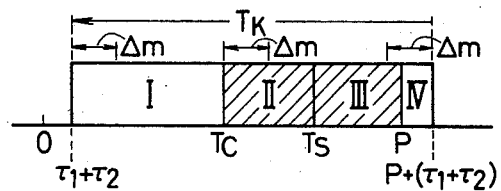
FIG. 12
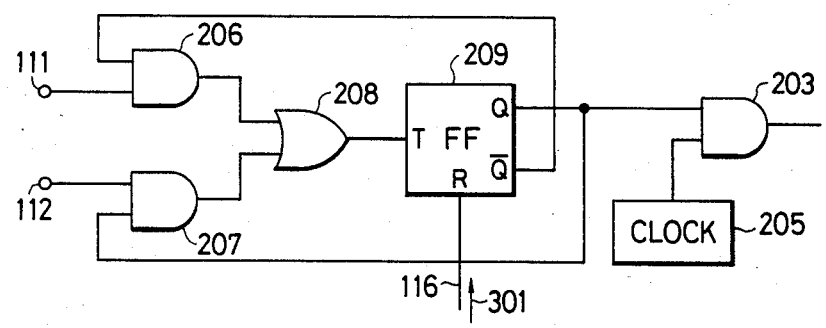

PHASE DIFFERENCE MEASURING APPARATUS

BACKGROUND OF THE INVENTION

The present invention relates to phase difference measuring apparatus for measuring the phase of a transmission circuit, such as an amplifier, a filter, a phase shifter, a transmission line or the like.

A conventional phase difference measuring apparatus is arranged as follows: A first signal obtained by passing a test signal through a transmission circuit under test and a second signal, which is the test signal having not been applied to the transmission circuit, are supplied as input signals and waveform-shaped into rectangular waves; one waveform-shaped output signal is polarity-inverted; the polarity-inverted signal and the other waveform-shaped output signal are ANDed with each other; the AND output is level-converted so that its peak value may take a predetermined value; the level-converted output is applied to a smoothing circuit (a low-pass filter circuit) to have its level averaged; and the averaged level is measured by a voltmeter. By calibrating the indication of the voltmeter in terms of phase, the phase difference between the first and second signal is indicated by the voltmeter. Such an arrangement of the prior art phase meter is briefly described in "Electron" at pages 47–48 published on Nov. 10, 1977.

This prior art phase difference measuring apparatus employs the smoothing circuit for obtaining the average level, but a desired degree of measurement accuracy cannot be obtained unless the time constant of the smoothing circuit is changed in accordance with the frequency of the signal (i.e. the input signal) to be measured. Accordingly, it is necessary to adopt such an arrangement that switches the time constant of the smoothing circuit in accordance with the measuring frequency range, which makes the measuring operation complex. The measurement accuracy is dependent upon the precision of an analog circuit, such as the level converter, the smoothing circuit or the like, and an expensive arrangement is needed for achieving measurement accuracy higher than 0.1°. Further, since the phase difference is measured as a voltage value, the voltmeter is required.

SUMMARY OF THE INVENTION

It is therefore an object of the present invention to provide a phase difference measuring apparatus which is able to achieve high measurement accuracy at low cost and with ease and is simple in operation for measurement.

Another object of the present invention is to provide a phase difference measuring apparatus which achieves high measurement accuracy by averaging a plurality of measured values.

In accordance with the present invention, two measurement signals, that is, first and second signals, are respectively waveform-shaped by first and second waveform shaping circuits into first and second rectangular wave signals, which are supplied via changeover switches to first and second input terminals of a time interval measuring circuit, or a selected one of the first and second rectangular wave signals is provided in common to the first and second input terminals. The time interval measuring circuit counts clock pulses from a clock pulse source over the time interval between corresponding edges of each of the rectangular wave signals supplied to the first and second input terminals. The changeover switches are controlled by control means to provide the selected rectangular wave signal to the time interval measuring circuit, and the output count value of the time interval measuring circuit at that time is applied to calculating means for calculating the period of the input signal. Further, under the control of the control means the first and second rectangular wave signals are supplied to the time interval measuring circuit, and the output count value of the time interval measuring circuit is applied to the calculating means to calculate the time difference between the first and second rectangular wave signals and then to calculate the phase difference between the first and second input signals from the calculated time difference and period, the phase difference thus obtained being displayed on display means.

When the two input rectangular wave signals are closer to each other than a predetermined amount, the time interval measuring circuit counts the aforesaid clock pulses for a period of time corresponding to the sum of the time difference between the rectangular wave signals and one period thereof. When such a count result is obtained, a correction is made in the phase difference calculation by the calculating means.

By performing the abovesaid time interval measurement a plurality of times and averaging the measured results, the measurement accuracy is increased. For raising the period measurement accuracy correspondingly, a rectangular wave signal to be applied in common to the first and second input terminals of the time interval measuring circuit is frequency-divided and then provided to the time interval measuring circuit. This enhancement of accuracy by averaging is intended mainly to lessen the influence of phase fluctuation (jitter) of the input signal which introduces dispersion in the measured values. When the phase difference is close to 0°, the measured values may become small values close to 0° or large values close to 360°. Consequently, if these small and large values are added together and averaged, the resulting mean value greatly deviates from the correct phase difference. To avoid this, the range of values which the measured time difference can take is divided into four regions and, according to the region to which the measured time interval belongs, the time difference corresponding to one period of the input signal is subtracted from the measured time difference and the resulting difference is processed as the measured time difference. Further, when the measured time difference belonging to a particular region is obtained, subsequent measured time differences belonging to the adjoining regions are also regarded as belonging to the same region.

BRIEF DESCRIPTION OF THE DRAWINGS

FIGS. 3A–3F are the timing charts explanatory of an example of the operation for measuring the period P by the apparatus of FIG. 1;

FIGS. 4A–4G are timing charts explanatory of an example of the operation for measuring the time difference Tk by the apparatus of FIG. 1;

FIGS. 5A–5G are timing charts explanatory of an example of the time difference measuring operation when the time difference between two signals is small;

FIG. 8 is a diagram showing, by way of example, the division of the range of values over which the time difference Tk can assume;

FIG. 11 is a diagram showing a general way of dividing the range of values over which the time difference Tk can take; and FIG. 12 is a logical circuit diagram illustrating another example of a time interval measuring circuit 106.

DESCRIPTION OF THE PREFERRED EMBODIMENTS

Figure 1:
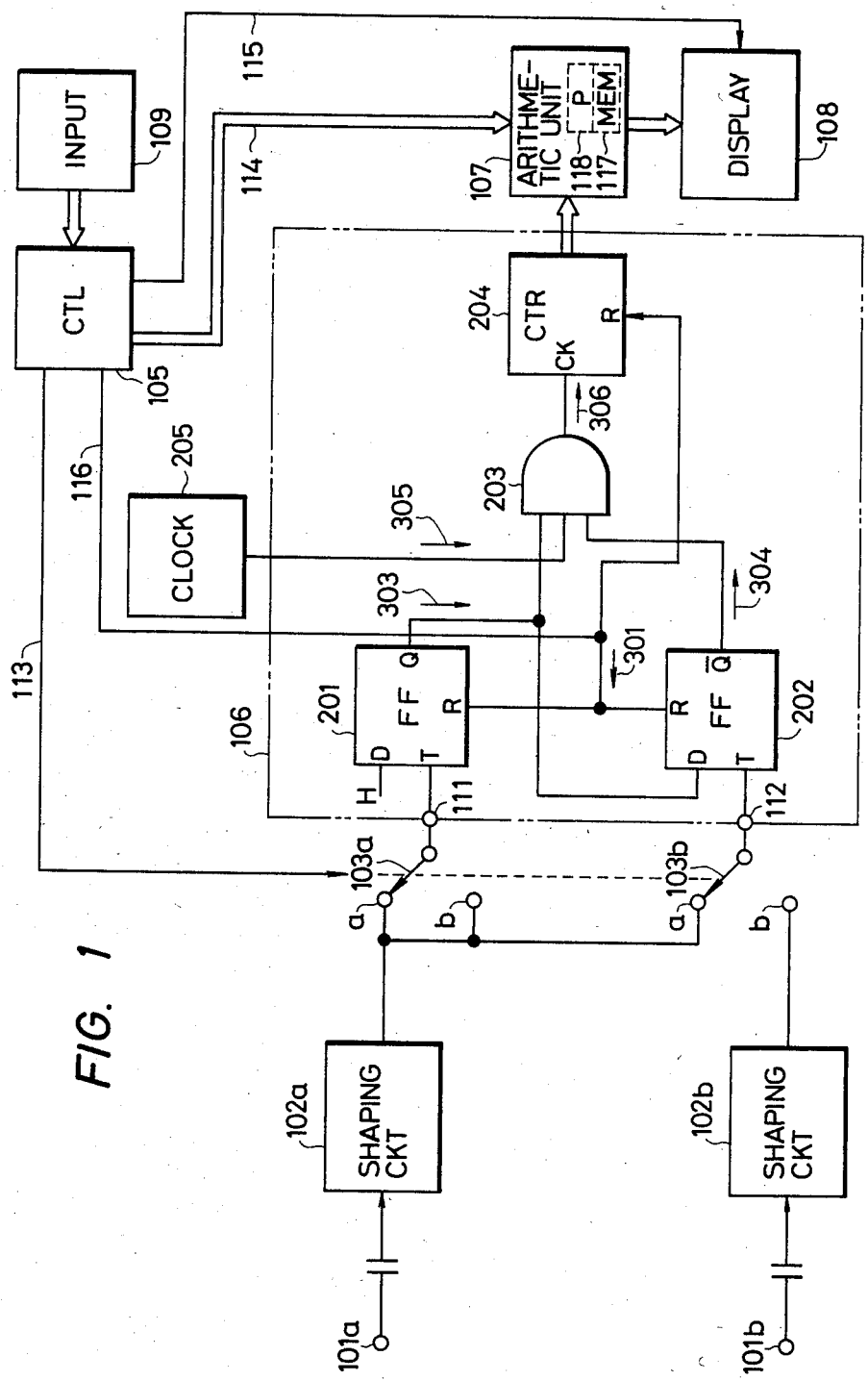
FIG. 1 is a block diagram illustrating an example of phase difference measuring apparatus embodying the present invention.

FIG. 1 illustrates an embodiment of the present invention. Input terminals 101a and 101b are connected to waveform shaping circuits 102a and 102b, respectively. To the input terminal 101a is supplied, for example, a test signal having passed through a transmission circuit (not shown), and to the input terminal 101b is supplied a test signal from the input side of the transmission circuit. The signals to be measured, that have been applied to the two input terminals 101a and 101b, are waveform-shaped by the waveform shaping circuits 102a and 102b into rectangular waves. The outputs of the waveform shaping circuits 102a and 102b are connected to fixed terminals b of mode changeover switches 103a and 103b, respectively. To fixed terminals a of the mode changeover switches 103a and 103b is commonly connected the output side of the waveform shaping circuit 102a. Output terminals of the mode changeover switches 103a and 103b are connected to input terminals 111 and 112 of a time interval measuring circuit 106, respectively. The mode changeover switches 103a and 103b are activated under the control of a controller 105 via a signal line 113. The controller 105 is formed, for instance, by a microcomputer having incorporated therein a latch. The mode changeover switches 103a and 103b are usually electronic switches, such as FETs, transistors or the like.

When the mode changeover switches 103a and 103b are held on the side of the fixed terminals a, the system is in a period measuring mode of operation and when they are connected to the fixed terminals b, the system is in a mode of operation for measuring the time difference between two signals. That is to say, the time interval measuring circuit 106 measures, as the number of clock pulses, the period P of the input signal supplied to the input terminal 101a and, further, similarly measures, as the number of clock pulses, a time difference Tk, for example, between the times of the rising of the two input signals applied to the input terminals 101a and 101b. The measured results are transferred to an arithmetic unit 107 under the control of the controller 105. The arithmetic unit 107 calculates the period P and the time difference Tk from the measured numbers of pulses and then computes, from the calculation results, a phase difference between the two input signals. The phase difference thus obtained is sent, under the control of the controller 105 via a signal line 115, to a display 108 to display thereon the angle of the phase difference in a digital form. An input operating part 109 is an input part for the controller 105.

The time interval measuring circuit 106 can be constituted, for instance, by two edge-trigger D flip-flops 201 and 202, an AND gate 203 and a counter 204. Trigger input terminals T of the two D flip-flops 201 and 202 are connected to the input terminals 111 and 112 of the time interval measuring circuit 106, respectively. The one D flip-flop 201 is given a logic H at its data input terminal D, and its output terminal Q is connected to one input terminal of the AND gate 203 and a data input terminal D of the other D flip-flop 202, the output terminal $\bar{Q}$ of which is connected to another input terminal of the AND gate 203. Connected to still another input terminal of the AND gate 203 is a clock signal source 205. An output terminal of the AND gate 203 is connected to a clock input terminal ck of the counter 204. A reset signal can be applied from the controller 105 to a reset terminal R of each of the D flip-flops 201 and 202 and the counter 204 via a signal line 116. The count value of the counter 204 is transimitted as the output of the time interval measuring circuit 106 to the arithmetic unit 107.

Figure 2:
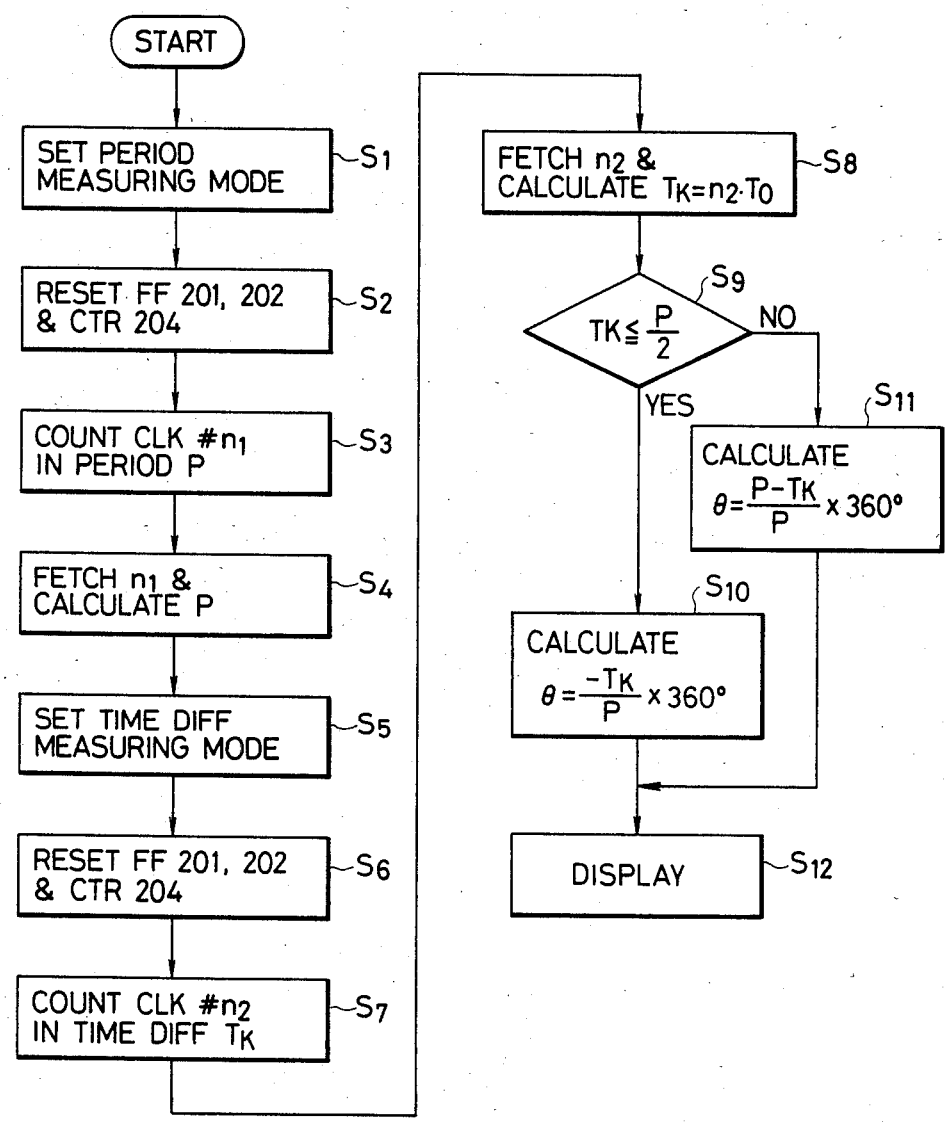
FIG. 2 is a flowchart showing, by way of example, the operation of the apparatus of FIG. 1.

The phase measuring apparatus of FIG. 1 operates in such a sequence as shown in FIG. 2. Upon starting the apparatus, the mode changeover switches 103a and 103b are connected to the fixed terminals "a" to set the apparatus to the period measuring mode in step $S_1$. In step $S_2$ a reset signal 301 is provided on the signal line 116 as shown in FIG. 3A, resetting the flip-flops 201 and 202 and the counter 204. As a result of this, at the instant $t_1$ of application of the reset signal, the output at the output terminal Q of the flip-flop 201 drops to a logic L as indicated by 303 in FIG. 3C, whereas the output at the output terminal $\bar{Q}$ of the flip-flop 202 rises to the logic H as indicated by 304 in FIG. 3D. In this state a rectangular wave signal 302 (FIG. 3B) is provided from the waveform shaping circuit 102a to the input terminals 111 and 112 of the time interval measuring circuit 106. By a first rise of the rectangular wave signal 302 (at the time $t_2$) the flip-flops 201 and 202 are both triggered, and the logic H is input into the flip-flop 201 as shown in FIG. 3C and the logic H is output from its output terminal Q. At this time, the logic L at the output terminal Q of the flip-flop 201 is read into the other flip-flop 202, so the output 304 at its output terminal $\bar{Q}$ remains at the logic H as shown in FIG. 3D. Accordingly, the logic H is applied to the two input terminals of the AND gate 203 to permit the passage therethrough of clock pulses 305 (FIG. 3E) from the clock signal source 205, and the clock pulses 305 having passed through the AND gate 203 are counted by the counter 204. In FIG. 3F reference numeral 306 indicates the clock pulses which have passed through the AND gate 203. When the rectangular wave signal 302 rises up next at the time $t_3$ as shown in FIG. 3B, the flip-flops 201 and 202 are triggered by the rise of the rectangular wave signal 302. In this case, the output of the flip-flop 201 remains at the logic H as shown in FIG. 3C but the logic H output of the flip-flop 201 is read into the flip-flop 202, so the output 304 at its output terminal $\bar{Q}$ goes down to the logic L. In consequence, the AND gate 203 inhibits the passage of the clock pulses 305 at the time $t_3$. This is the period measurement in step $S_3$ in FIG. 2. The count value $n_1$ of the counter 204 thus obtained is sent to the arithmetic unit 107 in step $S_4$ and, in the arithmetic unit 107, the period P is calculated from the count value $n_1$. Letting the period of the input signal and the period of the clock pulses 305 be represented by P and $T_0$, respectively, the period P of the input signal can be obtained by $P=n_1 \cdot T_0$. The calculated period P is stored in an area 118 of a memory 117 in the arithmetic unit 107.

In the next step $S_5$ the mode changeover switches 103a and 103b are connected to the fixed terminals "b" to alter the apparatus into the time difference measuring mode. Accordingly, signals 401 and 402 of different phases, such as shown in FIGS. 4B and 4C, are provided from the waveform shaping circuits 102a and 102b to the trigger input terminals T of the flip-flops 201 and 202, respectively. In step $S_6$ the controller 105 applies the reset signal 301 (FIG. 4A) to the flip-flops 201 and 202 and the counter 204 to reset them. As a result of this, the outputs at the output terminals Q and $\overline{Q}$ of the flip-flops 201 and 202 change to the logic L and the logic H, respectively, at the time $t_1$ when the reset signal 301 rises up as is the case with FIG. 3A, as shown in FIGS. 4D and 4E. In this state, when the signal 401 applied to the trigger terminal T of the flip-flop 201 rises to the logic H, the flip-flop 201 is triggered at that time $t_2$ and the output signal 303 at its output terminal Q is inverted to the logic H as shown in FIG. 4D. Thereafter, upon rise-up of the signal 402 applied to the trigger terminal T of the flip-flop 202 at the time $t_3$, the flip-flop 202 inputs thereinto by the rise of the signal 402 the logic H signal of the flip-flop 201 and, consequently, the output signal 304 at the output terminal $\overline{Q}$ of the flip-flop 202 is inverted to the logic L as shown in FIG. 4E.

Hence the AND gate 203 is controlled to be open for the period of time corresponding to the time difference Tk between the two signals 401 and 402, during which it permits the passage therethrough of the clock pulses 305 shown in FIG. 4F. In FIG. 4G reference numeral 403 indicates the clock pulses which have passed through the AND gate 203. The counter 204 counts the clock pulses 403. This is the time difference measurement in step $S_7$. In ste $S_8$ the count value $n_2$ of the counter 204 is transferred to the arithmetic unit 107, wherein the time interval Tk is computed by $Tk=n_2 \cdot T_0$. Further, the arithmetic unit 107 decides, in step $S_9$, whether the time difference Tk is equal to or smaller than P/2 or not. If so, the arithmetic unit 107 proceeds to step $S_{10}$, in which a phase difference $\theta$ is obtained from the period P obtained previously and the time difference Tk. The phase difference $\theta$ is calculated by the following expression (1):

$$\theta = -\frac{Tk}{P} \times 360° \qquad (1)$$

On the other hand, if the time difference Tk is larger than P/2 in step $S_9$, then the arithmetic unit 107 proceeds to step $S_{11}$, in which the phase difference $\theta$ is calculated by the following expression (2):

$$\theta = \frac{P - Tk}{P} \times 360° \qquad (2)$$

The calculation results in steps $S_{10}$ and $S_{11}$ are displayed on the display means 108, such as a CRT display or printer, in step $S_{12}$.

Incidentally, when the time difference Tk between the two rectangular wave signals 401 and 402 is too small, there is the possibility that the output 304 of the flip-flop 202 cannot be inverted by the rise of the rectangular wave signal 402 (at the time $t_3$) immediately after the rise of the rectangular wave signal 401 (at the time $t_2$) by which the output 303 of the flip-flop 201 was inverted. In this state, the output 304 of the flip-flop 202 is inverted by the rise of the rectangular signal 402 in the next period (at the time $t_4$). This means that the measured time difference Tk is longer than the actual time difference Tk' by the time corresponding to one period P of the input signals 401 and 402. In this case, the time difference Tk is larger than P/2 in step $S_9$ and, in step $S_{11}$, the calculation of the expression (2) is conducted, by which the measured value is corrected, obtaining the true phase difference $$-\frac{Tk}{P} \times 360°.$$

The time difference Tk is measured between the two input signals after being shaped into rectangular wave signals as described previously. In this case, phase and amplitude variations and waveform distortions of the input signals and a trigger error during their waveform shaping cause variations in the timing of the rising-up of the rectangular wave signals, generating jitter. Consequently, the time difference Tk obtained by only one measurement contains an error. This error can be reduced by performing the measurement a plurality of times and averaging the measured values. By conducting the measurement $10^M$ times, the measurement accuracy is raised at the rate of $\sqrt{10^M}$. On the other hand, the accuracy of measurement of the period P can be increased by frequency dividing the rectangular wave signal and measuring the period of the frequency divided outputs. By selecting the frequency dividing number to be $10^N$, the measurement accuracy of the period is raised at the rate of $10^N$.

Figure 6:
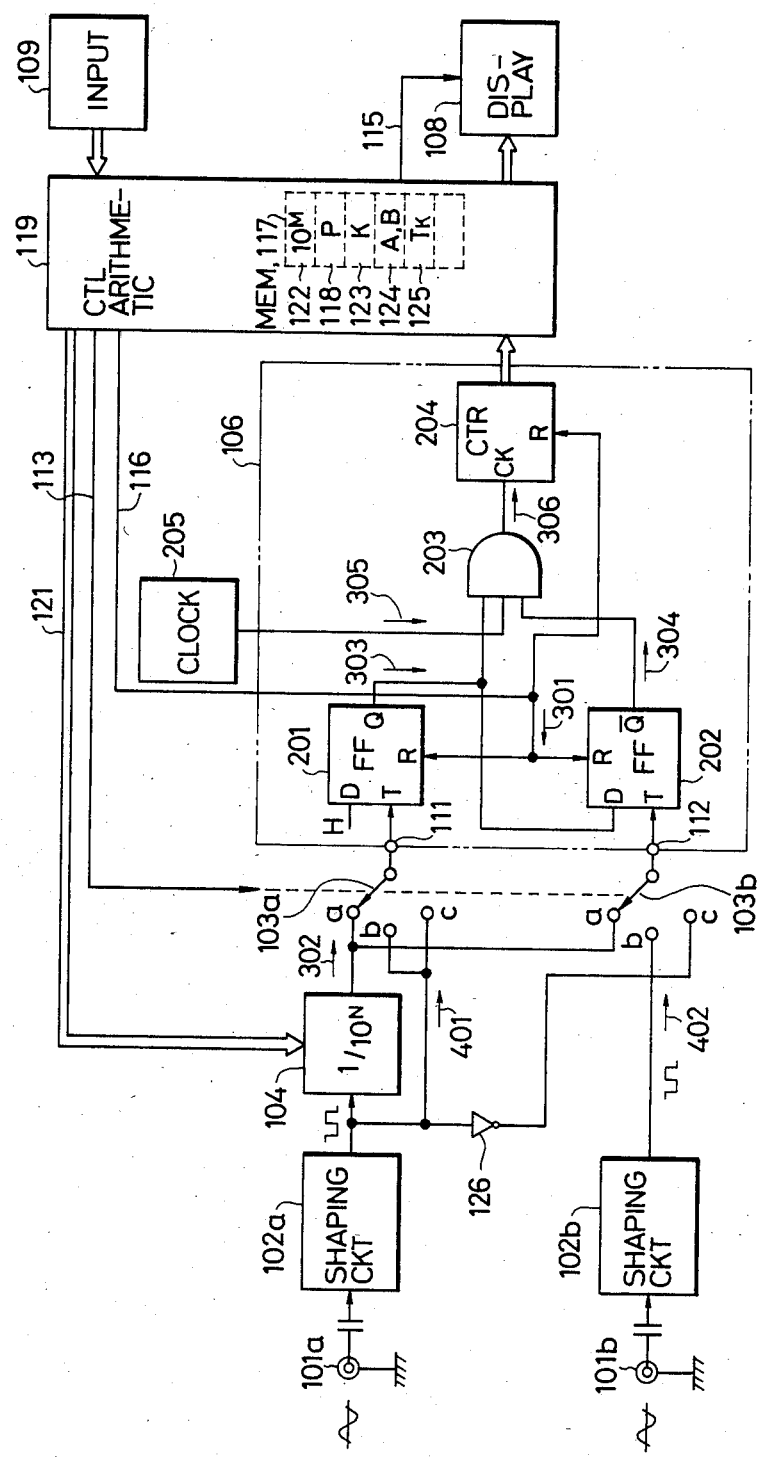
FIG. 6 is a block diagram illustrating an example of the phase difference measuring apparatus of the present invention in the case of measuring the time difference a plurality of times and averaging the measured values.

Referring now to FIG. 6 in which the parts corresponding to those in FIG. 1 are identified by the same reference numerals, a description will be given of a specific example of the arrangement for raising the measurement accuracy by making the measurement a plurality of times. In this example, the output side of the waveform shaping circuit 102a is connected to the input side of a frequency divider 104, the output side of which is connected to the fixed terminals "a" of the mode changeover switches 103a and 103b. This is the case in which a control arithmetic unit 119 formed by a microcomputer with a latch is used both as the controller 105 and as the arithmetic unit 107. The frequency dividing number $10^N$ of the frequency divider 104 can be set by the control arithmetic unit 119 via a signal line 121.

Figure 7:
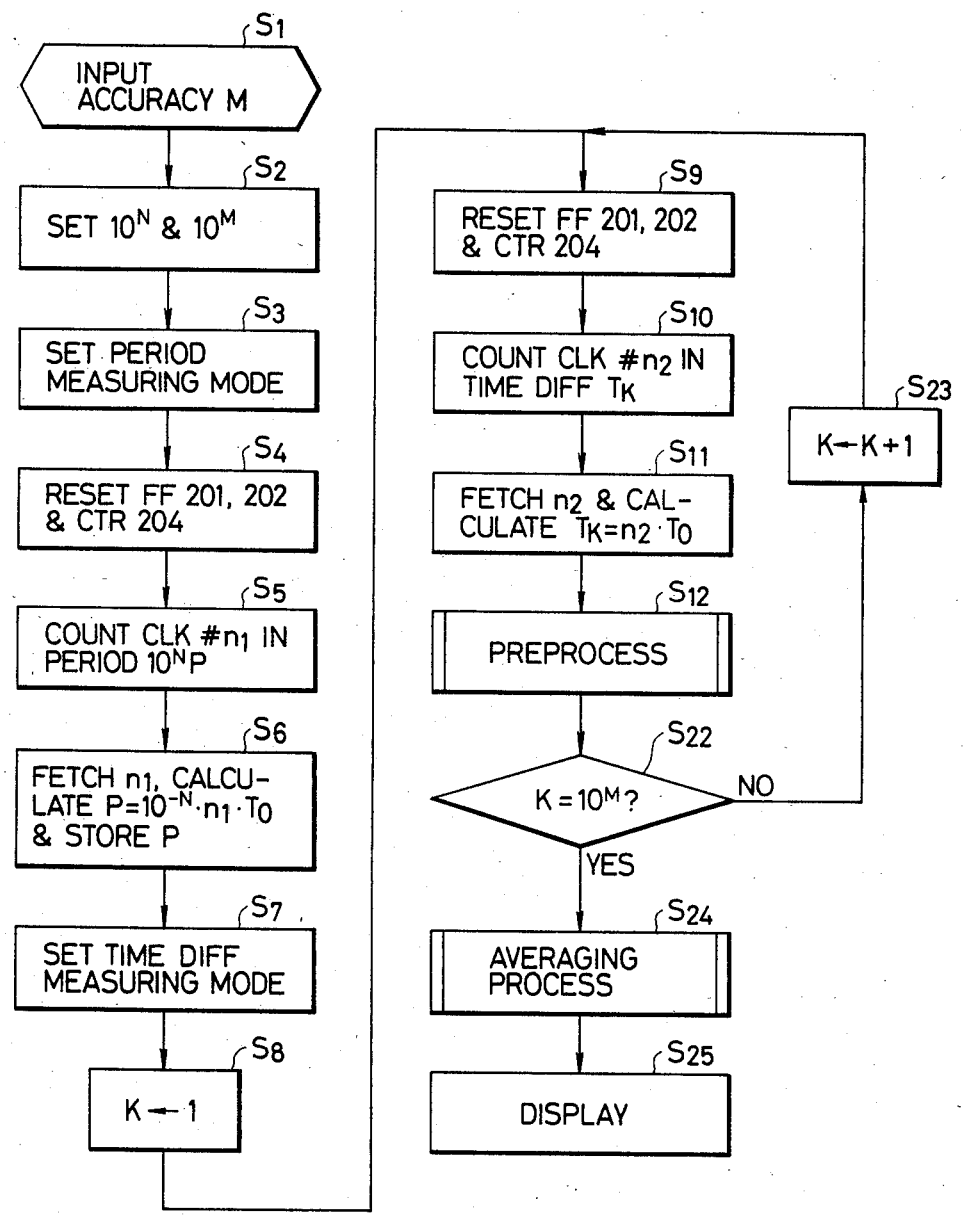
FIG. 7 is a flowchart showing an example of the operation of the apparatus depicted in FIG. 6.

FIG. 7 shows an example of the operation of the apparatus shown in FIG. 6. In step $S_1$ the input operation part 109 is manipulated to input into the control arithmetic unit 119 an index of the measurement accuracy M that is desired to be obtained. In step $S_2$ the control arithmetic unit 119 sets the frequency dividing number $10^N$ for the frequency divider 104 in accordance with the inputted accuracy index M and, at the same time, sets the required number of measurements $10^M$ in an area 122 of the memory 117 in the control arithmetic unit 119. The value of N is selected to be the smallest integer satisfying $\sqrt{10^M} \leq 10^N$, i.e. $M/2 \leq N$ for a given M (M=1, 2, 3 ...). For example, for the respective values of M=1, 2, 3, 4..., the values of N are 1, 1, 2, 2, ... In step $S_3$ the mode changeover switches 103a and 103b are connected to the fixed terminals "a" to set up the period measuring mode. In step S$_4$ the reset signal 301 is provided to the flip-flops 201 and 202 and the counter 204 to reset them. In step S$_5$ the period measurement takes place in the same manner as described previously in respect of FIG. 3 but, in this case, the clock pulses are counted during the period $10^N$ P of the frequency divided output of the frequency divider 104. In step S$_6$ the count value n$_1$ of the counter 204 is input into the control arithmetic unit 119 to calculate the perioid P by $10^{-N} \cdot n_1 \cdot T_0$, and the calculation result P is stored in the area 118 of the memory 117.

In step S$_7$ the mode changeover switches 103a and 103b are connected to the fixed terminals "b" to set up the time difference measuring mode. In step S$_8$ the count value K of a measurement number counter 123 in the memory 117 is reset to a 1. In step S$_9$ the reset signal is delivered to reset the flip-flops 201 and 202 and the counter 204. In step S$_{10}$ the time difference Tk between the outputs 401 and 402 of the waveform shaping circuits 102a and 102b is measured, as the number n$_2$ of clock pulses, by the same operation as described previously with regard to FIGS. 4 and 5. In step S$_{11}$ the count value n$_2$ of the counter 204 is input into the control arithmetic unit 119, in which the time difference Tk is calculated by $n_2 \cdot T_0$, and the operation proceeds to step S$_{12}$, in which averaging preprocessing takes place.

In the case of averaging the measured time differences Tk, if they are directly averaged, then a serious error may sometimes occur. That is, when the phase difference θ is close to 0°, the time difference Tk obtained assumes a small value or a value close to the period P owing to the aforementioned jitter. Consequently, if such time differences Tk are averaged as they are, then the resulting mean value becomes close to P/2; namely, the measured result takes a value close to 180° although the true phase difference is 0°. In the case where the time differences Tk of small and large values are obtained as mentioned above, the time difference Tk of large value is subjected to a subtraction, Tk−P, and the resulting difference and the time difference Tk of small value are averaged, by which a correct mean value can be obtained.

By the way, as described previously in respect of FIG. 5, when the phase difference θ is small, the time difference Tk is measured longer by one period P. Letting τ$_1$ and τ$_2$ respectively stand for the time interval occuring between the triggering of the flip-flop 201 by the rise of the rectangular wave signal 401 and the rising of the output at its output terminal Q to the logic H, and the time interval occurring between the triggering of the flip-flop 202 by the rise of the rectangular wave signal 402 to read thereinto the logic H of the flip-flop 201 and the lowering of the output at the output terminal $\overline{Q}$ to the logic L, the value that the measured time difference Tk between the rectangular wave signals 401 and 402 can take is in the following range:

$$\tau_1 + \tau_2 \leq Tk < P + \tau_1 + \tau_2$$

This range is divided into four regions and, depending on which one of them the obtained time difference Tk belongs to, it is processed as follows. That is, as shown in FIG. 8, the four regions I, II, III and IV cover the abovesaid range from $\tau_1 + \tau_2$ to P/2, from P/2 to 3P/4, from 3P/4 to P and from P to P+τ$_1$+τ$_2$, respectively. When the measured time difference Tk belongs to the region I, it is used as it is. When the measured time difference Tk belongs to any one of the regions II, III and IV, it is used in the form of Tk−P under some conditions as exlained in the following. Accordingly, when the measured time difference Tk is in the region IV, the abovesaid processing corrects the value obtained by measurement conducted longer by one period P. The measured time differences Tk belonging to the regions II and III are subjected to the processing Tk−P, by which they are converted into negative values with respect to 0°. Consequently, in the case where the true phase difference θ lies in the neighborhood of 0° and the measured time differences Tk are scattered over a small-value portion of the region I and regions IV and III, their mean value becomes a positive or negative small value Tk, so that; a correct mean value is obtained. In this way, the occurrence of an error is prevented which results from the averaging of the time differences in the vicinity of the phase difference 0°.

When the phase difference θ lies in the neighborhood of 180°, however, the measured time differences Tk are distributed over the regions I and II owing to jitter. In this case, if the time differences Tk in the region I and the differences Tk−P of the time differences Tk in the region II are averaged by the abovesaid processing, then the average assumes a value close to zero, which is a large error since the mean value corresponding to the true phase difference should be close to P/2. To avoid this, when the measured time difference Tk obtained first after the start of measurement belongs to the region I, even if the subsequent time differences Tk are in the region II, they are used as they are, that is, they are not used in the form of Tk−P, and when the measured time difference Tk obtained first belongs to the region II, the subsequent time differences Tk are used in the form of Tk−P. In other words, in the case where the measured time differences Tk are distributed over the regions I and II, they are regarded as belonging to the region I or II alone depending on whether the firstly measured time difference, i.e. T$_1$, falls in region I or II, and are process accordingly.

Incidentally, the regions II and III are not combined into one region for the following reason: Since the region IV is narrow, if the measured time differences Tk are obtained distributed over the regions II, IV and I, then the measured time differences Tk belonging to the regions II and I are processed as belonging to the same region, in accordance with the processing for solving the problem which arises in the event that the phase difference is in the vicinity of 180°, and this results in a large error. For this reason, the region III is provided.

Figure 9:
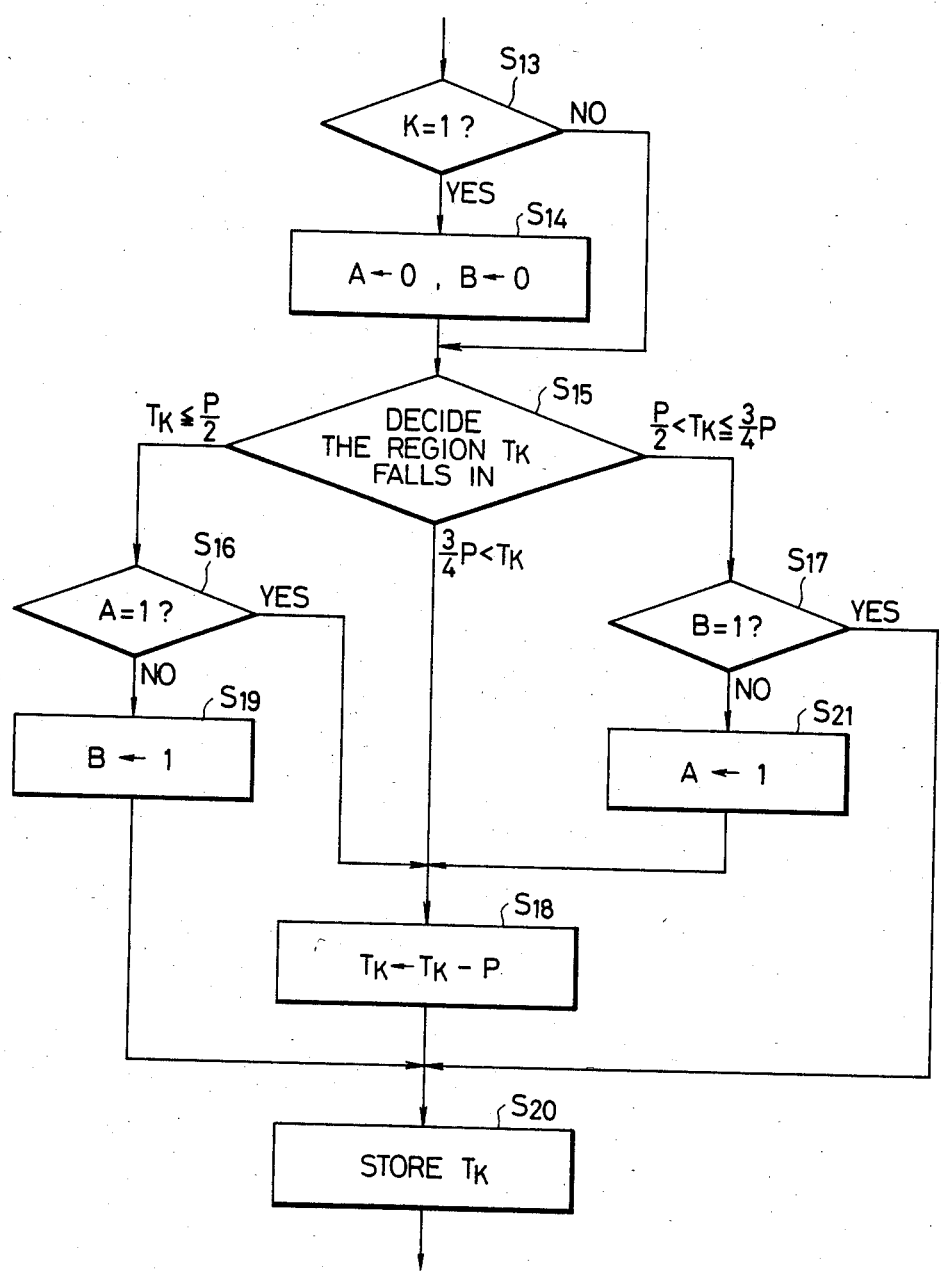
FIG. 9 is a flowchart showing an example of the preprocessing for averaging in step $S_{12}$ in FIG. 7.

Such processing for the measured time differences Tk takes place in step S$_{12}$. FIG. 9 shows the flow of the preprocessing operation for averaging. In FIG. 9, it is checked in step S$_{13}$ whether the number of measurements K is 1 or not, and in the case of K=1, that is, in the case of first time difference measurement, flags A and B are each made a "0" and stored in a memory area 124 of the memory 117 in step S$_{14}$. In step S$_{15}$ it is decided which one of the regions the measured time difference Tk belongs to. When K is not 1, that is, in the cases of a second or subsequent time interval measurement, the operation proceeds directly to step S$_{15}$. In step S$_{15}$, if the measured time difference Tk is decided to be less than P/2 or to belong to the region I, the operation proceeds to step S$_{16}$. If the measured time difference Tk is decided to be in the range of P/2 to 3P/4 or to belong to the region II, the operation proceeds to step S$_{17}$. Further, if the measured time difference Tk is decided to be more than 3P/4 or to belong to the region III or IV, the operation proceeds to step $S_{18}$.

In step $S_{16}$ it is checked whether the flag A is a "1" or not, and if not, that is, if the first measured time difference $T_1$ belongs or has belonged to the region II, then the flag B is made a "1" in step $S_{19}$ and the operation proceeds to step $S_{20}$. In the case where the flag A is a "1" in step $S_{16}$, it means that at least one of the measured time differences Tk obtained so far belongs to the region II, and the operation proceeds to step $S_{18}$, in which the measured time difference Tk is subjected to the calculation Tk−P, and the resulting difference is used as Tk for averaging. In step $S_{17}$ it is checked whether the flag B is a "1" or not, and if not, that is, in the case where none of the measured time differences Tk obtained so far belongs to the region I, the flag A is made a "1" in step $S_{21}$ and the operation proceeds to step $S_{18}$. In step $S_{18}$ the measured time difference Tk is subjected to the calculation Tk−P, and the calculation result is used as Tk for averaging. If it is decided in step $S_{17}$ that the flag B is a "1", that is, in the case where the first measured time difference $T_1$ belonged to the region I, the operation proceeds to step $S_{20}$ and the time difference Tk is not subjected to the processing Tk−P though it belongs to the region II.

When it is decided in step $S_{15}$ that the measured time difference Tk belongs to the region III or IV, it is subjected to the calculation Tk−P in step $S_{18}$, and the calculation result is used as Tk for averaging. In this way, the measured time difference Tk or the calculation result Tk by Tk−P, obtained in accordance with the region to which the measured time difference Tk belongs to, or the state of the previous measurement, is stored in the area 125 of the memory 117 (step $S_{20}$). Thus the preprocessing for averaging in step $S_{12}$ is completed.

Figure 10:
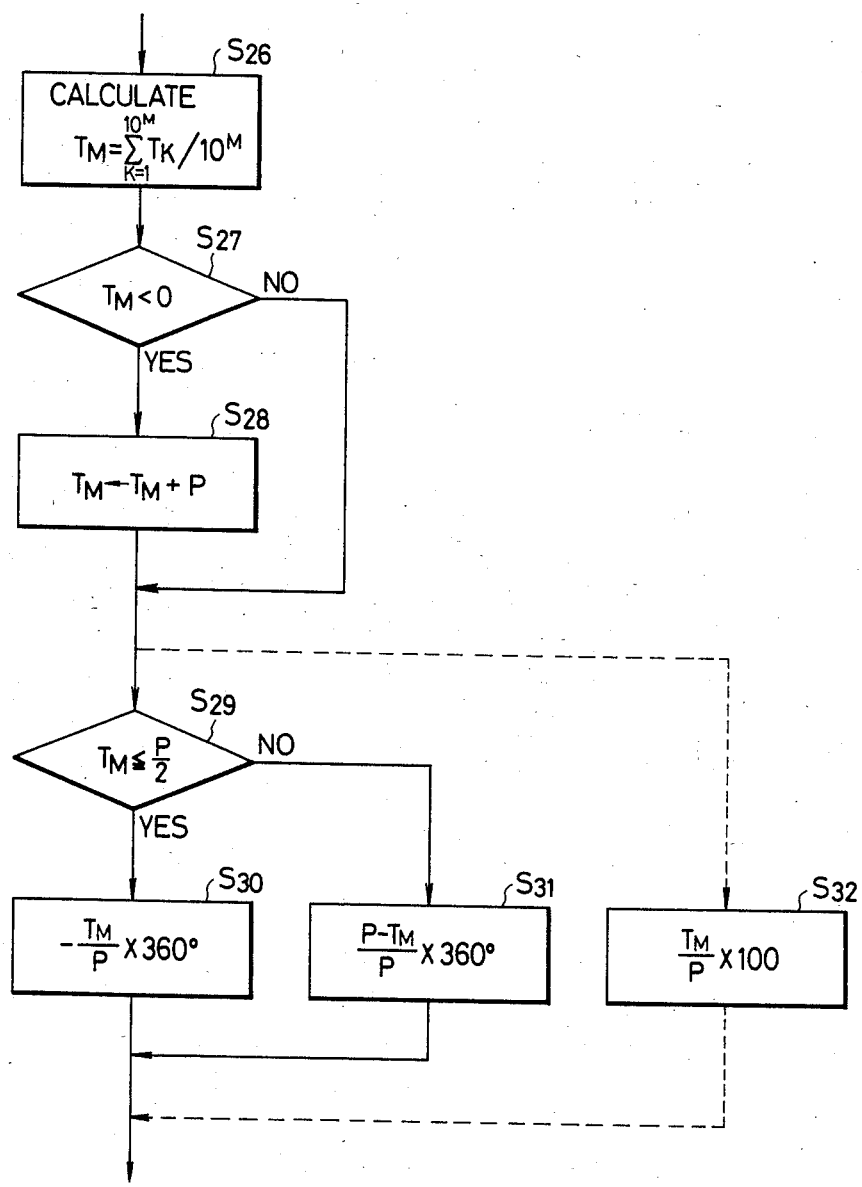
FIG. 10 is a flowchart showing an example of the final calculating operation in step $S_{24}$ in FIG. 7.

Turning back to FIG. 7, it is checked in step $S_{22}$ whether the number of time interval measurements K has reached the set value $10^M$ or not, and if not, the number K is incremented by 1 in step $S_{23}$, and the operation returns to step $S_9$, repeating the time difference measurement. In the case where the number of measurements K has reached the set value $10_M$ in step $S_{22}$, the operation proceeds to final averaging process of step $S_{24}$, and the calculation result is displayed on display means in step $S_{25}$. The final averaging process of step $S_{24}$ includes such processing as shown in FIG. 10. In step $S_{26}$ the $10^M$ measured time differences Tk stored in the area 125 of the memory 117 are read out therefrom, and their mean value $T_M$ is obtained by $$\sum_{k=1}^{10^M} Tk/10^M.$$

In step $S_{27}$ it is checked whether the mean value $T_M$ is negative or not, and if so (the mean value $T_M$ often belongs to the region II or III) a corrective calculation is conducted in step $S_{28}$ for adding P to the mean value $T_M$ to obtain a positive value $T_M$, and the operation proceeds to step $S_{29}$. In the case where the mean value $T_M$ is 0 or positive in which case the means value $T_M$ often belongs to the region I or IV.) the operation immediately proceeds to step $S_{29}$. In step $S_{29}$ it is decided whether the mean value $T_M$ is larger or smaller than P/2, and if it is equal to or smaller than P/2, then a calculation $-(T_M/P) \times 360°$ is conducted in step $S_{30}$. If it is decided in step $S_{29}$ that the mean value $T_M$ is larger than P/2, the operation proceeds to step $S_{31}$, in which a calculation $\{(P-T_M)/P\} \times 360°$ is conducted. The calculation results in steps $S_{30}$ and $S_{31}$ are displayed on the display means in step $S_{25}$ of FIG. 7. In this case, when the rectangular wave signal 402 lags the rectangular wave signal 401 by a phase difference within 180° as in FIG. 4, the phase difference $\theta$ therebetween is displayed as $-\theta$, and when the rectangular wave signal 402 leads the rectangular wave signal 401 by a phase difference within 180°, the phase difference $\theta$ is displayed as $+\theta$.

While in the above the measured time difference Tk is stored in the area 125 for each time interval measurement in the preprocessing for averaging in step $S_{12}$, it is also possible to employ such a method in which a first measured value $T_1$ is stored in the memory 117 while in second and subsequent measurements the differences between the first measured value $T_1$ and the subsequent measured values Tk are obtained and are accumulated, the accumulated value is stored as $$\sum_{k=2}^{n} (Tk - T_1)$$

in the memory 117, and the mean value in step $S_{26}$ is obtained by calculating $$T_M = T_1 + \frac{\sum_{k=2}^{10^M} (Tk - T_1)}{10^M}.$$

With this method, the data for storing the measured time differences become two kinds of data $T_1$ and $\Sigma(Tk-T_1)$, thus permitting the storage capacity of the memory 117 to be reduced correspondingly.

In the case of dividing the range of the value Tk as shown in FIG. 8, if a maximum fluctuation width $\Delta_m$ of jitter is within P/4, that is, within $\pm 45°$, then there is no likelihood that the accuracy of an averaged time difference is rather impaired by erratic preprocessings for averaging the measured time differences. Such a division of the range of the value Tk is intended to prevent an error from being made by the averaging process. The widths of the individual regions are dependent upon the maximum jitter fluctuation width $\Delta_m$ as described below. Letting the boundaries between the regions I and II and between the regions II and III be represented be represented by $T_C$ and $T_S$, respectively, as shown in FIG. 11, when the sum of the widths of the regions I and IV, that is, $T_C$, is smaller than the maximum jitter fluctuation width $\Delta_m$, there are cases where the measured time differences are distributed over the regions III, I and II. In such a case, when a first measured value belongs to the region II, the measured values Tk in the regions I and II are made Tk−P and they become large negative values, but the measured values belonging to the region III are made Tk−P, by which they become small negative values. If these values are averaged, a large error results. Accordingly, the sum $T_C$ of the widths of the regions I and IV is selected equal to or larger than the maximum jitter fluctuation width $\Delta_m$.

Similarly, if the width $T_S - T_C$ of the region II is selected smaller than the maximum jitter fluctuation width $\Delta_m$, then the measured values Tk may sometimes be distributed over the regions I, II and III and, in this case, since the measured values Tk belonging to the region III are not processed in the same manner as that for the measured values belonging to the regions I and II, a large error results. Accordingly, the width $T_S-T_M$ of the region II is selected equal to or larger than the maximum jitter fluctuation width $\Delta_m$. Further, if the width of the region III is selected so that the sum of the widths of the regions III and IV is smaller than the maximum jitter fluctuation width $\Delta_m$, the measured values Tk may also be distributed over the regions II, III, IV and I in some cases. The measured values belonging to the regions II and I are processed as the values belonging to the same region, and these measured values and those belonging to the region III are averaged, so that there is a fear of a large error being made. Accordingly, the sum of the widths of the regions III and IV must be selected equal to or larger than the maximum jitter fluctuation width $\Delta_m$. In view of the above, for dividing the range of the value Tk in a manner to maximize the jitter fluctuation width $\Delta_m$, the widths of the regions I, II and III are selected equal to one another, neglecting the width of the region IV since it is very small.

In the above the phase difference $\theta$ is obtained as a value within $\pm 180°$, but it may also be obtained in the range of 0° to 360°. In such a case, instead of carrying out steps $S_9$, $S_{10}$ and $S_{11}$ of FIG. 2, a calculation $(Tk/P)\times 360°$ is conducted when $P>Tk$ and, in the case of $Tk\geq P$, a calculation $\{(Tk-P)/P\}\times 360°$ is performed. Similarly, in FIG. 10, a calculation $(T_M/P)\times 360°$ is carried out instead of carrying out steps $S_{29}$, $S_{30}$ and $S_{31}$. In FIG. 8, the boundary between the regions II and III may also be selected as 2P/3.

The time interval measuring circuit 106 need not always specifically to the example shown in FIG. 1 but may also be arranged, for instance, as illustrated in FIG. 12. The input terminals 111 and 112 are each connected to an input terminal of a respective one of AND circuits 206 and 207. Output terminals of the AND circuits 206 and 207 are connected to input terminals of an OR circuit 208, the output side of which is, in turn, connected to a trigger terminal T of a toggle flip-flop 209. Output terminals $\overline{Q}$ and Q of the flip-flop 209 are connected to the other input terminals of the AND circuits 206 and 207, respectively. The output Q of the flip-flop 209 is connected to the one input terminal of the AND gate 203, the other input terminal of which is connected to the clock signal source 205, and the signal line 116 is connected to a reset terminal R of the flip-flop 209. Upon resetting of the flip-flop 209 by the reset signal 301, the output at the output terminal Q goes down to the logic L and the output at the output terminal $\overline{Q}$ rises to the logic H. When the signal applied to the input terminal 111 rises up to the logic H from the logic L in this state, it triggers the flip-flop 209 via the AND circuit 206 and the OR gate 208, forcing the output at the output terminal Q of the flip-flop 209 to the logic H. In consequence, the AND gate 208 is opened, permitting the passage therethrough of the clock pulses. Thereafter, when the signal applied to the input terminal 112 rises up to the logic H from the logic L, it triggers the flip-flop 209 via the AND circuit 207 and the OR gate 208 to make the output at the output terminal Q of the flip-flop 209 go to the logic L, closing the AND gate 203. The clock pulses having passed through the AND gate 203 are counted by the counter 204 as described previously.

While in the above the time interval between the rises of the input signals to the input terminals 111 and 112 is measured as the number of clock pulses by the time interval measuring circuit 106, it is also possible to measure the time interval between the falls of the input signals as the number of clock pulses.

A duty ratio can also be measured easily through utilization of the phase measuring apparatus described above. To this end, for example, as shown in FIG. 6, fixed terminals "c" are further provided in the mode changeover switches 103a and 103b, and when they are connected to the fixed terminals "c", the duty ratio measuring mode is set. The output side of the waveform shaping circuit 102a is connected directly to the fixed terminal "c" of the switch 103a and also it is connected to the fixed terminal "c" of the switch 103b via an inverter 126. Accordingly, when set to the duty ratio measuring mode, the time interval measuring circuit 106 counts the clock pulses occurring in one logic H period of the rectangular wave signal 401. For this count value, the operations shown in FIGS. 7, 9 and 10 are performed, and as shown by a broken line the operation shifts from steps $S_{27}$ and $S_{28}$ to step $S_{32}$, in which a calculation $(T_M/P)\times 100$ is carried out, and the calculation result is displayed as the duty ratio on the display means 108.

As has been described in the foregoing, according to the present invention, the period P and the time difference Tk of the signals to be measured are each measured as the number of clock pulses by the time interval measuring circuit 106 and, by using them, the phase difference $\theta$ is measured using the measured period P and the time difference Tk. Accordingly, the measurement accuracy can be raised by increasing the clock pulse frequency. Since an analog filter or the like is not employed, high measurement accuracy can be obtained with a relatively simple arrangement. Further, the present invention does not involve such an operation as switching a time constant according to the range of the frequency to be measured, and hence is simplified in operation. Moreover, the measurement accuracy can be raised by performing measurement a plurality of times and averaging the measured values and, in such a case, the occurrence of a large error by jitter can be prevented by the preprocessing for the averaging operation. Besides, the apparatus of the present invention permits measurement of the phase difference without the necessity of using a voltmeter.

It will be apparent that many modifications and variations may be effected without departing from the scope of the novel concepts of the present invention.

What is claimed is:

1. Phase difference measuring apparatus for measuring the phase difference between first and second input signals of the same frequency, comprising:
   first and second waveform shaping circuits for waveform-shaping the first and second input signals into respective first and second waveform-shaped signals;
   a clock signal source for generating clock pulses;
   a time interval measuring circuit provided with first and second input terminals and connected to the clock signal source, for counting the clock pulses from the clock signal source over the time interval occurring between corresponding edges of respective ones of said first and second waveform-shaped signals that are supplied to the first and second input terminals and to provide corresponding count values;
   changeover switching means for switching the output of the waveform shaping circuits between a first connection state in which the output of the first waveform shaping circuit is connected to both of the first and second input terminals of the time interval measuring circuit, and a second connection state in which the outputs of said waveform shaping circuits are connected to respective ones of said first and second input terminals of the time interval measuring circuit;

operating means for calculating the period P of said first and second input signals, from each respective count value obtained from the time interval measuring circuit in the first connection state of the changeover switching means, and calculates a respective measured time difference Tk corresponding to said phase difference between said first and second waveform-shaped signals, from each respective count value obtained from the time interval measuring circuit in the second connection state of the changeover switching means, for calculating the phase difference betweeen said first and second input signals from said period P and each said measured time difference Tk, and for controlling the respective operations of said changeover switching means and said time interval measuring circuit.

2. Phase difference measuring apparatus according to claim 1, wherein a frequency divider is inserted in the output of said first waveform shaping circuit and the output of the frequency divider is connected to both of said first and second input terminals, in said first connection state, and the operating means causes the measurment of said measured time difference Tk in said second connection state to be conducted a predetermined plurality of times, and averages together respective values corresponding to each said measured time difference Tk to obtain an average value Tm for said phase difference between said first and second waveform-shaped signals.

3. Phase difference measuring apparatus according to claim 2, wherein:

said first and second input signals are such that said phase difference therebetween has a maximum phase fluctuation $\Delta_m$;

the range of said measured time difference Tk is $\tau$ to $P+\tau$, $\tau$ being a total delay time of said time interval measuring circuit for beginning and ending said counting of said clock pulses, and said range being successively divided into a first region $\tau$ to $T_C$, a second region $T_C$ to $T_S$, a third region $T_S$ to P, and a fourth region P to $P+\tau$, wherein Tc and Ts are respective successively larger values within said range and the sum of the first and fourth regions, the second region, and the sum of the third and fourth regions are each selected to be larger than said maximum phase fluctuation $\Delta_m$; and said operating means operates such that, for providing said average value $T_m$ for said phase different when a respective one of said measured time difference Tk lies within any one of the second, third and fourth regions, the corresponding respective value is Tk−P, when a measured time difference Tk within the first region is the first of the plurality that is obtained, the respective value for each subsequently obtained measured time difference Tk is Tk itself, and when a time difference Tk within the second region is the first of said plurality that is obtained, the respective value of each measured time difference Tk subsequently obtained within said first region is Tk−P.

4. Phase difference measuring apparatus according to claim 3, wherein $T_C = P/2$.

5. Phase difference measuring apparatus according to claim 4, wherein $T_S = 3/4P$.

6. Phase difference measuring apparatus according to claim 4, wherein $T_S = 2/3P$.

7. Phase difference measuring apparatus according to claim 3, wherein said operating means adds the period P to said average value $T_M$ when $T_M$ is negative, to provide a final average value for said phase difference.

8. Phase difference measuring apparatus according to claim 2, wherein said frequency divider is a variable frequency divider the frequency dividing ratio of which can be set by said operating means, and said operating means further provides for inputting a selected measurement accuracy, sets the frequency dividing ratio of said frequency divider corresponding to the inputted selected measurement accuracy, and sets the number of measurements of said measured time difference Tk to a value corresponding to the inputted desired measurement accuracy.

9. Phase difference measuring apparatus according to claim 3, wherein said operating means stores a first measured time difference $Tk_1$ of said plurality, determines and accumulates differences between said stored first measured time difference $Tk_1$, and each subsequent measured time difference Tk of said plurality, and calculates the average $T_M$ from the accumulated differences and said first measured time difference $Tk_1$.

10. Phase difference measuring apparatus according to claim 3, wherein, during a third connection state, a polarity inverter is connected to the output of one of the first and second waveform shaping circuits, said changeover switching means provides that the input and output of the polarity inverter are connected to said first and second input terminals, respectively, and said operating means calculates the duty ratio of the respective one of said input signals from an average value from respective count values obtained when the changeover switching means is set to the third connection state and said measured period P of said output of the respective one of said waveform shaping circuits to which said polarity inverter is connected.

11. Pause difference measuring apparatus according to any one of claims 1, 2. 3, 8 or 10, wherein the time interval measuring circuit comprises a first flip-flop triggered by a respective edge of the waveform-shaped signal applied to the first input terminal, a second flip-flop triggered by the respective edge of the waveform-shaped signal applied to the second input terminal and having an input connected to the output of said first flip-flop, a gate circuit opened by the outputs of the first and second flip-flops to permit the passage therethrough of the clock pulses over the time interval occurring between the triggering of the first flip-flop and the triggering of the second flip-flop, and a counter for counting the output clock pulses of the gate circuit.

12. Phase difference measuring apparatus according to any one of claims 1, 2, 3, 8 or 10, the time interval measuring circuir comprising:

a flip-flop having Q and $\overline{Q}$ outputs, and first and second gates each having a first input connected to a respective one of said Q and $\overline{Q}$ outputs, said first and second input terminals being connected to second inputs of the first and second gates, respectively, and the first and second gates being connected at their outputs to a trigger terminal of the flip-flop via an OR gate;

a third gate to which said Q output of the flip-flop is input, wherein said clock signal source is input to said third gate; and a counter for counting the clock pulses connected to the output of said third gate;

wherein said count values obtained in each said connection state of said changeover switching means are output from said third gate.

13. Phase difference measuring apparatus according to claim 1, wherein when said two waveform-shaped signals applied to the first and second input terminals are sufficiently close in phase to each other, said time interval measuring circuit counts the cock pulses over the time interval occurring between the edge of the respective waveform-shaped signal applied to said first input terminal and the respective edge of the other waveform-shaped signal that is applied to said second input terminal, but delayed for one period P relative to the respective first edge of said other waveform shaped signal immediately following said edge of the waveform-shaped signal applied to said first input terminal, and said operating means makes a corresponding correction by subtracting the measured period P from each measured time difference Tk that is longer than said period P.

14. The phase difference measuring apparatus according to claim 1, comprising display means connected to said operating means, for displaying the average phase difference obtained by said operating means.

15. Phase difference measuring apparatus for measuring the phase difference between first and second input signals of the same frequency, comprising:

a clock signal source for generating clock pulses;

a time interval measuring circuit provided with first and second input terminals and connected to the clock signal source, for counting the clock pulses from the clock signal source over the time interval occurring between corresponding edges of respective signals corresponding to said first and second input signals that are supplied to the first and second input terminals and to provide corresponding count values;

changeover switching means for switching said signals corresponding to said first and second input signals between a first connection state in which the signal corresponding to said first input signal is connected to both of the first and second input terminals of the time interval measuring circuit, and a second connection state in which the signals corresponding to said first and second input signals are connected to respective ones of said first and second input terminals of the time inverval measuring circuit;

operating means for calculating the period P of said first and second input signals from each respective count value obtained from the time interval measuring circuit in the first connection state of the changeover switching means and each respective measured time difference Tk between said first and second input signals from each respective count value obtained from the time interval measuring circuit in the second connection state of the changeover switching means, for calculating the phase differenee between said first and second input signals from said period P and each said measured time difference Tk thus obtained, and for controlling the respective operations of said changeover switching means and said time interval measuring circuit;

wherein said first and second input signals are such that said phase difference therebetween has a maximum phase fluctuation $\Delta_m$;

the range of said measured time difference Tk is $\tau$ to $P+\tau$, $\tau$ being a total delay time of said time interval measuring circuit for beginning and ending said counting of said clock pulses, and said range being successively divided into a first region ? to $T_C$, a second region $T_C$ to $T_S$, a third regions $T_S$ to P and a fourth region P to $P+\tau$, wherein Tc and Ts are respective successively larger value, within said range;

the sum of the first and fourth regions and the sum of the second, third and fourth regions are each selected to be larger than said maximum phase fluctuation $\Delta_m$; and when one of said measured time difference Tk lies within any one of the second, third and fourth regions, the respective Tk−P is processed as the measured difference such that;

when a measured time difference Tk within the first region is obtained first, a subsequently obtained measured time difference Tk is processed as being within the second region without being converted to Tk−P; and when a measured time difference Tk belonging to the second region is obtained first, a subsequently obtained measured time difference is processed as being within the first region as Tk−P.

16. Phase difference measuring apparatus for measuring the phase difference between first and second input signals of the same frequency, comprising:

a clock signal source for generating clock pulses;

a time interval measuring means including first and second input terminals and flip-flop means having a first setting means connected to said first input terminal and responsive to reset the output of said flip-flop means to a predetermined logic state "A" upon receipt of a reset signal, and to set said flip-flop means to opposite logic state "$\overline{A}$" in response to a change in logic in a predetermined direction of a signal supplied to said first setting means from said first terminal, and a second setting means connected to said second input terminal and responsive to be rendered operable, upon receipt of said flip-flop means being set in said logic state "A", so as to set said flip-flop means from said logic state "$\overline{A}$", to said logic state "A" in response to a change in logic in said predetermined direction of a signal supplied to said second setting means from said second terminal;

counter means connected to the outputs of said flip-flop means, and controlled by said flip-flop means for counting the clock pulses from said clock source over the time interval during which said flip-flip means is in said logic state "A";

changeover switching means for switching between a first connection state in which a signal corresponding to the first input signals is connected to both of the first and second input terminals of the time interval measuring circuit, and a second connection state in which the signals corresponding to said first and second input signals are connected to respective ones of said first and second input terminals of the time interval measuring circuit; and operating means for calculating the period P of said first and second input signals from the count values obtained from the time interval measuring circuit in the first connection state of the changeover switching means and the measured time difference Tk between said signals corresponding to said first and second input signals from the count values obtained from the time interval measuring circuit in the second connection state of the changeover switching means, for calculating the phase difference between said first and second input signals from said period P and said time difference Tk thus obtained, and for controlling the respective operations of said changeover switching means and said time interval measuring circuit.

17. The apparatus of claim 15 or 16, comprising first and second waveform-shaping circuits for waveform-shaping the first and second input signals into respective first and second waveform-shaped signals, wherein said first and second waveform-shaped signals are provided to said first and second terminals of said time interval measuring circuits, as said signals corresponding to said first and second input signals.

18. Phase difference measuring apparatus for measuring the phase difference between first and second input signals of the same frequency, comprising:

a clock signal source for generating clock pulses;

a time interval measuring circuit provided with first and second input terminals and connected to the clock signal source, for counting the clock pulses from the clock signal source over the time interval occurring between corresponding edges of respective ones of said first and second input signals that are supplied to the first and second input terminals and to provide corresponding count values;

changeover switching means for switching said first and second input signals between a first connection state in which the first input signal is connected to both of the first and second input terminals of the time interval measuring circuit, and a second connection state in which the first and second input signals are connected to respective ones of said first and second input terminals of the time interval measuring circuit;

operating means for calculating the period P of said first and second input signals, from each respective count value obtained from the time interval measuring circuit in the first connection state of the changeover switching means, and calculates a respective measured time difference Tk corresponding to said phase difference between said first and second input signals, from each respective count value obtained from the time interval measuring circuit in the second connection state of the changeover switching means, for calculating the phase different between said first and second input signals from said period P and each said measured time difference Tk, and for controlling the respective operations of said changeover switching means and said time interval measuring circuit.

* * * * *

UNITED STATES PATENT AND TRADEMARK OFFICE
CERTIFICATE OF CORRECTION

PATENT NO. : 4,600,994

DATED : 15 July 1986

INVENTOR(S) : HAYASHI

It is certified that error appears in the above-identified patent and that said Letters Patent is hereby corrected as shown below:

[57] ABSTRACT, line 3, "signal" should be --signals--;
line 11, "terminals" should be --signals--.
Column 4, line 24, "transimitted" should be --transmitted--.
Column 5, line 41, "ste" should be --step--.
Column 8, line 1, "exlained" should be --explained--;
line 13, delete ";";
line 33, after "Tk" insert --in either region I or II--;
line 39, "process" should be --processed--.
Column 9, line 56, "(the" should be --(in which case the--;
line 61, "in" should be --(in--; "means" should be --mean --;
line 62, delete "."; after ")" insert --,--.
Column 10, line 15, after "117" insert --,--.
Column 11, line 3, "$T_M$" should be --$T_C$--;
line 33, after "always" insert -- be limited--;
line 36, delete "a"; delete "one of".
Column 12, line 19, after "line" insert --in Fig. 10--.
Column 14, line 46, "Pause" should be --Phase--;
line 62, "circuir" should be --circuit--.
Column 16, line, 11, "?" should be --τ--;
line 12, "regions" should be --region--.

Signed and Sealed this

Eleventh Day of November, 1986

*Attest:*

DONALD J. QUIGG

*Attesting Officer*  *Commissioner of Patents and Trademarks*